(12) United States Patent
Crippa et al.

(10) Patent No.: US 11,442,080 B2
(45) Date of Patent: Sep. 13, 2022

(54) CONTACT PROBE AND RELATIVE PROBE HEAD OF AN APPARATUS FOR TESTING ELECTRONIC DEVICES

(71) Applicant: TECHNOPROBE S.P.A., Cernusco Lombardone (IT)

(72) Inventors: Roberto Crippa, Cernusco Lombardone (IT); Raffaele Vallauri, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 0 days.

(21) Appl. No.: 17/244,498

(22) Filed: Apr. 29, 2021

(65) Prior Publication Data

US 2021/0247422 A1 Aug. 12, 2021

Related U.S. Application Data

(63) Continuation of application No. 16/439,527, filed on Jun. 12, 2019, now Pat. No. 11,016,122, which is a continuation-in-part of application No. PCT/EP2017/081723, filed on Dec. 6, 2017.

(51) Int. Cl.
*G01R 31/28* (2006.01)
*G01R 1/073* (2006.01)
*G01R 1/067* (2006.01)
*G01R 3/00* (2006.01)

(52) U.S. Cl.
CPC ..... *G01R 1/07378* (2013.01); *G01R 1/06738* (2013.01); *G01R 1/06755* (2013.01); *G01R 3/00* (2013.01); *G01R 31/2886* (2013.01); *G01R 1/07357* (2013.01); *G01R 1/07371* (2013.01)

(58) Field of Classification Search
CPC ............ G01R 1/07378; G01R 1/06738; G01R 1/06755; G01R 1/07357; G01R 31/2886
See application file for complete search history.

(56) References Cited

U.S. PATENT DOCUMENTS

| | | | |
|---|---|---|---|
| 6,242,929 B1 | 6/2001 | Mizuta | |
| 10,119,991 B2 | 11/2018 | Chen et al. | |
| 2004/0051541 A1* | 3/2004 | Zhou | G01R 1/07378 324/756.03 |
| 2008/0006677 A1 | 1/2008 | Kumagai et al. | |
| 2012/0042509 A1 | 2/2012 | Takeya | |
| 2012/0176122 A1 | 7/2012 | Hirata et al. | |
| 2017/0299634 A1 | 10/2017 | Crippa et al. | |
| 2017/0307656 A1 | 10/2017 | Vallauri | |
| 2018/0003767 A1 | 1/2018 | Crippa et al. | |

* cited by examiner

*Primary Examiner* — Dominic E Hawkins
(74) *Attorney, Agent, or Firm* — Seed Intellectual Property Law Group LLP

(57) ABSTRACT

A contact probe comprises a probe body being extended in a longitudinal direction between respective end portions adapted to realize a contact with respective contact pads, at least one end portion having transverse dimensions greater than the probe body. Suitably, the end portion comprises at least one indentation adapted to house a material scrap being on the contact probe after a separation from a substrate wherein the contact probe has been realized.

20 Claims, 13 Drawing Sheets

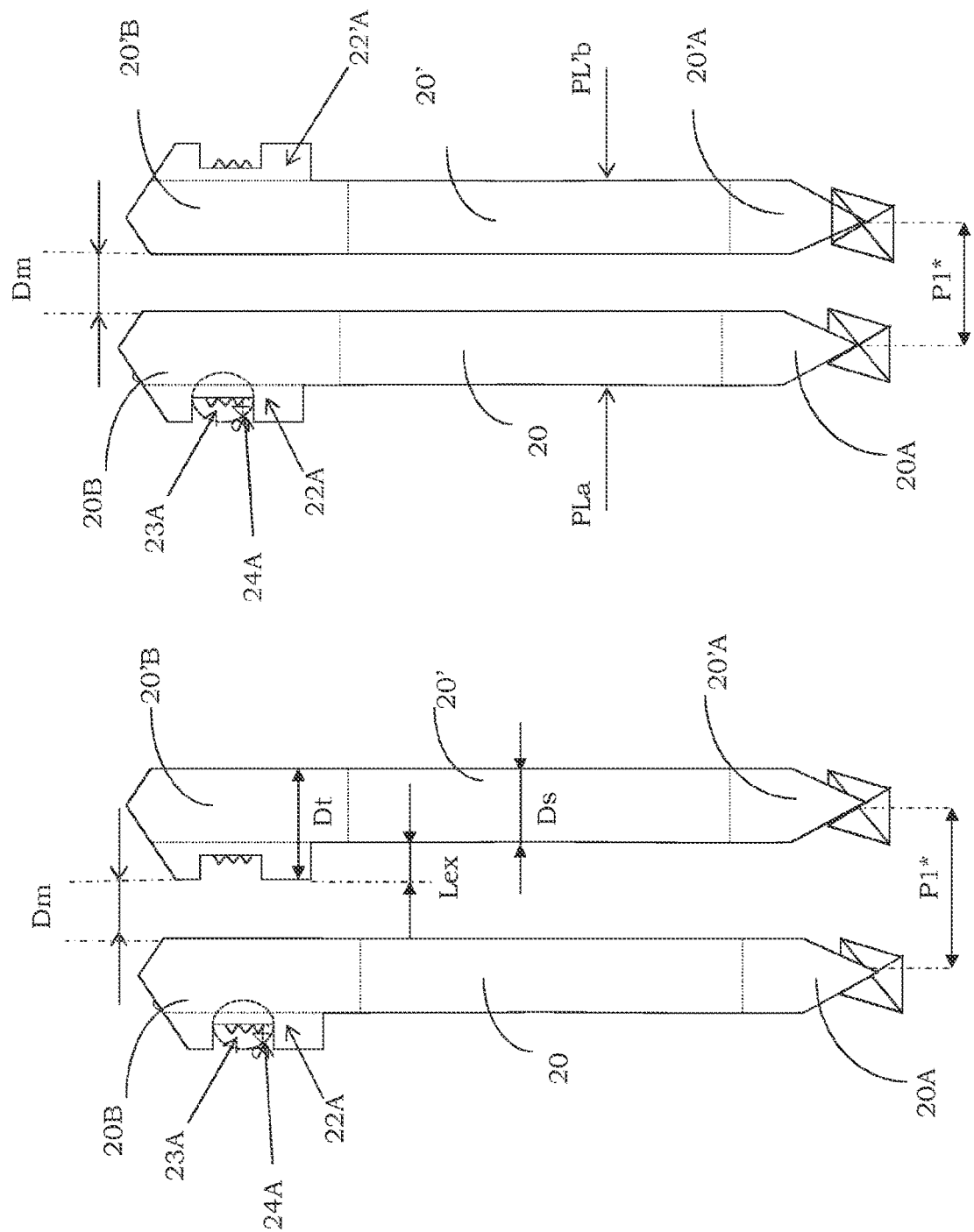

CONTACT PROBE AND RELATIVE PROBE HEAD OF AN APPARATUS FOR TESTING ELECTRONIC DEVICES

BACKGROUND

Technical Field

The present disclosure refers to a contact probe and to a corresponding probe head of an apparatus for testing electronic devices, more particularly to a contact probe and to a probe head of an apparatus for testing electronic devices that are integrated on a wafer and the following disclosure is made referring to this field of application with the sole aim of simplifying the presentation thereof.

Description of the Related Art

As it is well known, a probe head is a device adapted to electrically connect a plurality of contact pads of a microstructure, in particular an electronic device that is integrated on a wafer, with corresponding channels of a testing machine that performs the functionality testing, in particular electric, thereof, or the test, generically.

The test, which is performed on integrated devices, is particularly useful in detecting and isolating defective circuits as early as in the production phase. Normally probe heads are therefore employed for electric tests of devices integrated on wafers before cutting and assembling them inside a chip containment package.

Generally, a probe head comprises a plurality of movable contact elements or probes retained by at least one pair of plates or dies that are substantially plate-shaped and parallel to each other. Said dies are provided with suitable holes and are arranged at a certain distance from each other in order to leave a free space or air gap for the movement and possible deformation of the contact probes. In particular, the pair of dies comprises an upper die and a lower die, both provided with guide holes within which the contact probes axially slide, usually made of wires of special alloys with good electrical and mechanical properties.

Good connection between the contact probes and the contact pads of the device under test is ensured by pressing the probe head on the device itself, the contact probes, which are movable within the guide holes made in the upper and lower dies, undergoing, during that pressing contact, a bending inside the air gap between the two dies and a sliding inside such guide holes. Probe heads of this kind are commonly called probe heads with vertical probes and indicated with the English term: "Vertical probe head".

In particular, FIG. 1 schematically shows a probe head 10 comprising at least one lower plate-shaped support or die 2 and an upper plate-shaped support or die 3, having respective guide holes 2A and 3A within which at least one contact probe 1 slides.

It is pointed out that, for convenience, here and hereinafter the terms "upper" and "lower" have been used in connection with a local reference system of the figure, without considering them limitative.

The contact probe 1 has at least one end portion or contact tip 1A intended to abut onto a contact pad 4A of a device under test 4, so as to realize the mechanical and electrical contact between said device under test 4 and a test apparatus (not shown) of which such a probe head 10 forms an end element.

Here and hereinafter the term "contact tip" means an end zone or region of a contact probe intended to contact pads, said contact zone or region not being necessarily sharpened.

In some cases, the contact probes are fixedly fastened to the head itself in correspondence of the upper die: such probe heads are referred to as "blocked probe heads".

More frequently, however, probe heads are used with unblocked probes, i.e. probes not fixedly fastened, but held interfaced to a board through a micro-contact board: such probe heads are referred to as "unblocked probe heads". The micro-contact board is usually called "space transformer" since, besides contacting the probes, it also allows spatially redistributing the contact pads realized thereon with respect to the contact pads on the device under test, in particular relaxing the distance constraints between the centers of the pads themselves.

In this case, as shown in FIG. 1, the contact probe 1 has a further end portion or contact head 1B towards a contact pad 5A of such a space transformer 5. Good electrical contact between probes 1 and space transformer 5 is ensured by pressing the contact heads 1B of the contact probes 1 onto the contact pads 5A of the space transformer 5 analogously to the contact with the device under test 4.

The lower die 2 and the upper die 3 are suitably spaced by an air gap 6 that allows the deformation of the contact probes 1. Finally, the guide holes 2A and 3A are sized so as to allow a sliding of the contact probe 1 therein.

More in particular, during the pressing contact of the contact tips 1A or of the contact heads 1B of the probes 1 on the contact pads 4A and 5A of the device under test 4 and of the space transformer 5, respectively, the probe 1 slides in the guide holes 2A and 3A and gets deformed in correspondence of the air gap 6.

The shape of the deformation undergone by the probes and the force required to produce such a deformation depend on several factors, such as the physical characteristics of the alloy which the probes are made of and the value of the offset between the guide holes in the upper die and the corresponding guide holes in the lower die.

The correct working of a probe head is basically linked to two parameters: the vertical movement, or overtravel, of the contact probes and the horizontal movement, or scrub, of the contact tips of such contact probes. As known, it is important to ensure a suitable scrub of the contact tips so as to allow "scrubbing" the surface of the contact pads, in this way removing the impurities that are for example in the form of a thin layer or oxide film, thus improving the contact carried out by the probe head.

All these features should be evaluated and calibrated in the manufacturing step of a probe head since the good electrical connection between probes and device under test should always be ensured. In case of a testing head manufactured with the so-called "shifted plates" technology, the contact probes 1, which are also referred to as "buckling beam", are made straight, with a constant cross-section throughout their length, preferably rectangular, and usually they are sharpened at their ends in order to form the contact ends portions, in particular the contact tip 1A and the contact head 1B respectively, as shown in FIG. 1. It is thus known to provide, for this kind of probe heads, a shift between the lower die 2 and the upper die 3 in order to cause a deformation of the probe body, in a substantially central position, as in the example shown. These probe heads are also referred to as "shifted-plate probe heads".

A critical parameter in the probe head manufacturing is the distance (the so-called pitch) between centers of contact pads on the device under test. In fact, the pitch of the integrated electronic devices, with the progress of the relative manufacturing technologies, has become smaller and smaller, forcing a high packing of the contact probes in the probe head and causing positioning problems when the mutual contact between contact probes is to be avoided.

In the most recent technologies, the distance between the centers of contact pads on the integrated devices, usually indicated as pitch, has decreased up to values comprised between 30 µm and 80 µm. This pitch decrease affects configurations of the matrix type pads in an increasingly pressing manner. In this case, the distances both between contact centers of pads on a same line and between contact centers of pads on a same column have decreased up to values comprised between 30 µm and 80 µm.

As already said, this decrease in the pitch value of contact pads configurations of the devices under test of the most recent manufacturing causes problems connected to the contact between adjacent probes, and in particular between protruding portions thereof.

This problem is strongly felt when the contact probe 1 has at least one enlarged portion in correspondence of one end portion, in particular of the contact head 1B, essentially used to ensure that the probe cannot slip out of the corresponding guide holes realized in the upper and lower dies of the probe head and thus having greater dimensions than the rest of the contact probe, in particular at least one diameter greater than the diameter of the probe body, diameter meaning the maximum dimension of such cross-sections.

Just the increased dimensions of the enlarged portions of the contact probes exacerbate the above-mentioned packing problems, thus dramatically limiting the chance of approaching adjacent probes in correspondence of such portions, where the contact between adjacent probes is more likely, with respect to a longitudinal or transverse direction respectively, than a matrix distribution of the pads of the integrated device under test.

In other terms, while designing the contact probes and the probe head comprising them, it will be necessary to also consider a minimum value of the distance between adjacent probes, in particular in correspondence of the enlarged portions thereof, for instance the portions of the contact heads. Such a minimum distance, suitable to avoid the contact between adjacent probes, will obviously affect the distance or pitch of the contact pads of a device which the probe head will be able to test. It will be furthermore possible to provide equal or different minimum distance values for the longitudinal or transverse direction.

It is also known that the involved dimensions for such contact probes are extremely binding for the manufacturing methods of the contact probes. In particular, in the field of testing the most recent manufactured integrated circuits, the extremely reduced distance between the contact pads of the devices under test and consequently between the contact probes of the relative probe heads has challenged the dimensional limits of the traditional manufacturing methods of contact probes, which use in particular photolithographic, masking, growth and attack techniques.

Therefore, in recent years the interest in manufacturing methods of contact probes for probe heads using the laser technology has increased.

In particular, a manufacturing method by laser cutting which allows obtaining contact probes by "cutting out" a metal sheet in the final desired form for the probes usually comprises the steps of:
providing a substrate 11 made of a conductive material, as shown in FIG. 2A; and
defining each contact probe 10 by laser cutting according to a contour 10C desired for such a probe, as shown in dashed line in FIG. 2B.

In particular, as shown in FIG. 2C, the method provides the definition by laser cutting a plurality of contact probes 10 in the substrate 11, each of them provided with respective end portions 10A and 10B, meant as portions comprising a contact tip 10A or a contact head 10B of the contact probe 10, and extending according to a longitudinal development direction of the substrate 11, in particular a vertical direction Y as indicated in FIG. 2C.

The shape shown in the figures for contact tips 10A and contact heads 10B is absolutely arbitrary, since they can also have the same shape or different shapes from the illustrated ones.

Usually, the definition step realizes each contact probe 10 inside a corresponding frame 12 so as to be anchored to the substrate 11 through at least one relative material bridge 13, as schematically shown in FIG. 3A and in the enlargement of FIG. 3B.

Therefore, the method comprises a further separation step for separating the contact probes 10 from the substrate 11 by breaking the material bridges 13.

In particular, in the example shown in FIGS. 3A and 3B, each contact probe 10 has only one material bridge 13 that connects and holds it to the substrate 11 inside the corresponding frame 12, said material bridge 13 being realized in correspondence of one portion of the probe that is distinct from an end portion.

It is obviously possible to realize any number of material bridges 13, also located in other points of the contact probe 10 with respect to what is shown in FIGS. 3A and 3B, in a totally arbitrary manner.

For instance, as schematically shown in FIGS. 4A and 4B, it is possible to realize each contact probe 10 so as to be anchored to the substrate 11 still by a single material bridge 13, in this case realized in correspondence of its contact head 10B in a preferably side position. In this way, in fact, the material bridge 13 is in a position of the contact probe 10 having greater dimensions than the rest of the probe, namely in an area with a better mechanical seal, in particular useful at the moment of the separation of the contact probe 10 from the substrate 11 by breaking the material bridge 13 itself.

Furthermore, said positioning of the material bridge 13 prevents scraps and surface irregularities from being left in portions of the contact probe 10 that must slide in the guide holes of the upper or lower guides during the operation of a probe head that comprises such contact probes 10, as previously shown.

Indeed, it is well known that the breaking of the material bridges 13 during the separation of the contact probe 10 from the substrate 11 involves holding material, being anchored to the contact probe 10 in correspondence of the attachment of the bridge itself, called scrap and indicated with reference number 14 in FIG. 5. As already indicated, it is possible for this scrap 14 to be in correspondence of the contact head 10B of the contact probe 10, actually increasing the side footprint thereof and therefore reducing the chances of packing a great number of probes thus realized in order not to rick the contact between adjacent probes, just in correspondence of said scraps 14 located at the contact heads 10B.

It is furthermore usual to realize the contact probes 10 so that they have at least two material bridges 13 symmetrically located on the sides of the corresponding contact head 10B;

the separation of said contact probes 10 from the substrate 11 thus leaves scraps 14 located on both sides of the contact head 10B.

It is also noticed that a possible contact of adjacent probes in correspondence of such scraps 14, which are areas having high surface roughness, could at least cause such probes to get undesirably stuck, with the definitive loss of functionality of the probe head that comprises them.

BRIEF SUMMARY

An embodiment of the present disclosure is directed to a contact probe and a corresponding probe head for the connection with an apparatus for testing electronic devices, in particular integrated on a wafer, having structural and functional features so as to allow overcoming the limitations and drawbacks which still nowadays affect the systems made according to the prior art, in particular able to reduce the probabilities of a contact between its enlarged portions, for instance in correspondence of the contact heads of the probes, so as to allow a greater packing of the probes themselves inside the probe head, also for configurations of contact pads extremely close to each other, i.e. with a very small pitch.

The contact probe is provided with at least one indentation in correspondence of one end portion thereof, in particular a contact head, having greater dimensions than the rest of the probe, able to house an attachment scrap to the substrate which the probe has been obtained from, thus decreasing the risk of contact of the probes between each other once they have been housed in a corresponding probe head, also for configurations of contact pads extremely close to each other of a device under test by means of such a probe head.

The contact probe for a probe head for an apparatus for testing electronic devices comprises a probe body extended in a longitudinal direction between respective end portions adapted to realize a contact with respective contact pads, at least one end portion having transverse dimensions greater than the probe body, characterized in that the at least one end portion comprises an indentation adapted to house a material scrap being on said contact probe after a separation from a substrate wherein said contact probe has been realized.

Another embodiment is directed to a contacting element comprising respective first and second end portions and a body extended in a longitudinal direction between the first and second end portions, the first end portion having transverse dimensions greater than the body, the contacting element comprising material scraps due to a separation from a substrate wherein the contacting element is realized, wherein the first end portion comprises at least one indentation apt to house the material scraps being on the contacting element.

According to another aspect of the disclosure, a probe head for testing electronic devices is provided, the probe head comprising a plurality of contact probes, a first and second plate-shaped supports separated one another by a suitable air gap, the first and second plate-shaped supports having a plurality of guide holes for slidingly housing the plurality of contact probes, wherein each contact probe comprises respective first and second end portions and a probe body extended in a longitudinal direction between the first and second end portions, the first end portion having transverse dimensions greater than the probe body, the contact probe comprising material scraps due to a separation from a substrate wherein the contact probe is realized and the first end portion comprising at least one indentation apt to house the material scraps being on the contact probe.

The probe head comprises plate-shaped supports that are mutually suitably shifted so as to impart to the contact probes, which slide in the respective guide holes, a pre-deformation in correspondence of the air gap, wherein the enlarged portion of the first end portion of each of the contact probes protrudes from a wall of the contact probe, which rests on a wall of the guide hole of the plate-shaped support in proximity of the first end portion.

According to another aspect of the disclosure, the probe head further comprises a plurality of symmetrical contact probes, having contact heads which comprise enlarged portions projecting from both the side walls of the contact probe and a plurality of asymmetrical contact probes, having contact heads which comprise only one enlarged portion projecting from only one side wall of the contact probe, the enlarged portions comprising respective indentations adapted to house material scraps due to a separation of the contact probes from a substrate wherein the contact probes were formed, the symmetrical contact probes being arranged in abutment onto contact pads in a first region of the device under test having a greater pitch of a second region wherein contact pads are contacted by the asymmetrical contact probes.

The characteristics and advantages of the contact probe and of the probe head according to the disclosure will be apparent from the description, made hereafter, of an embodiment thereof, given by indicative and non-limiting example, with reference to the accompanying drawings.

BRIEF DESCRIPTION OF THE SEVERAL VIEWS OF THE DRAWINGS

FIGS. 10A and 10B schematically show different arrangements of a pair of adjacent contact probes, realized according to the embodiment of FIG. 8.

DETAILED DESCRIPTION

Figure 1:
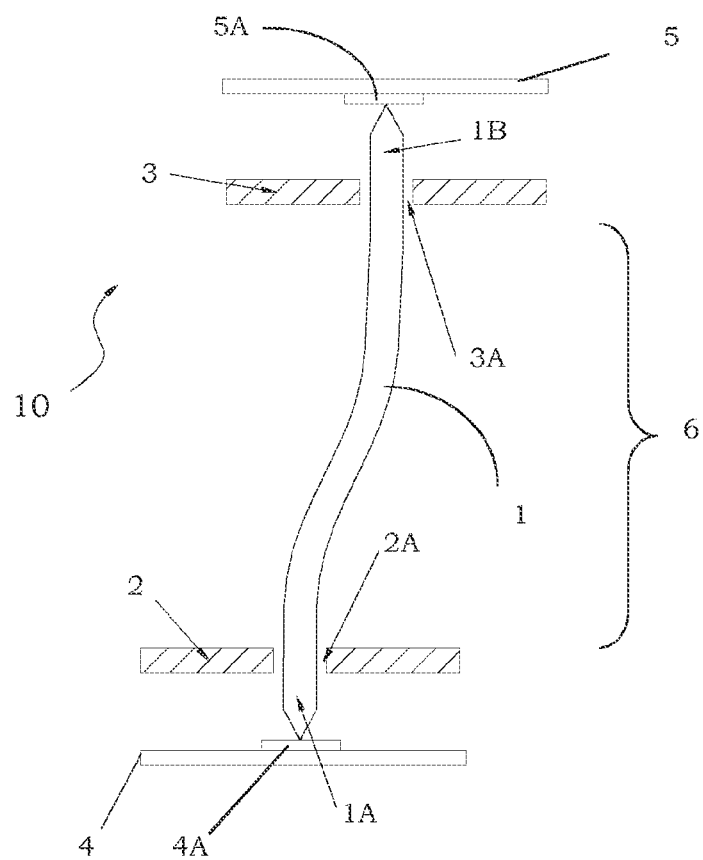
FIG. 1 schematically shows a probe head realized according to the prior art.
Figure 2A:
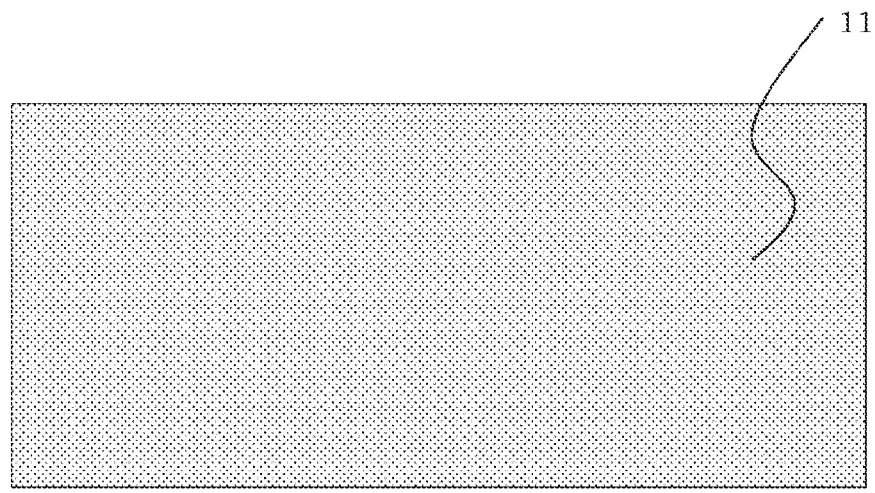
FIGS. 2A-2C schematically show different steps of the manufacturing method by laser cutting.
Figure 2B:
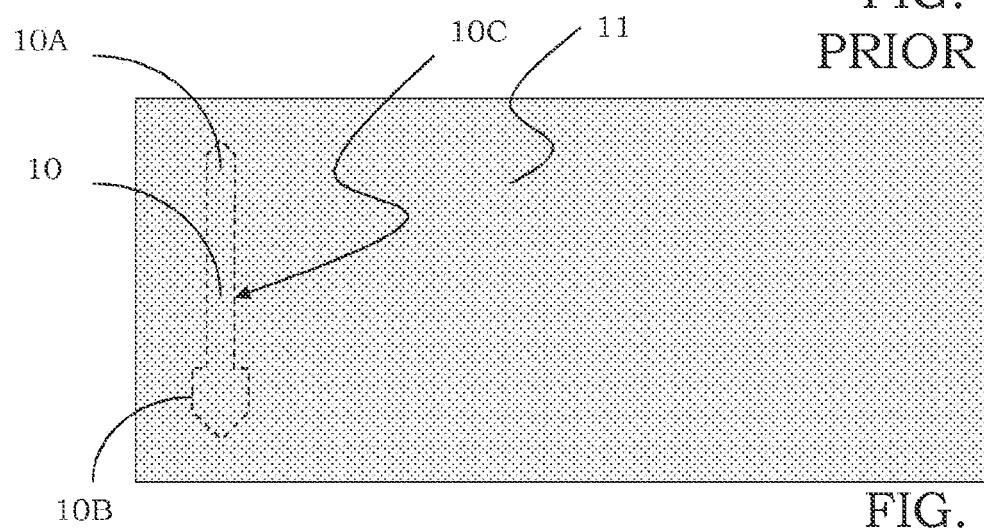
Figure 2C:
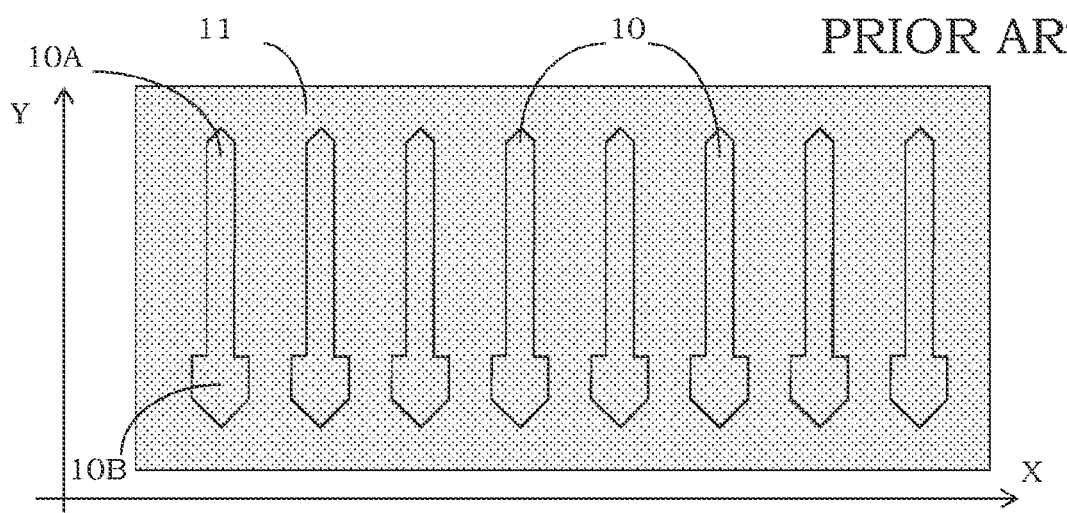
Figure 3A:
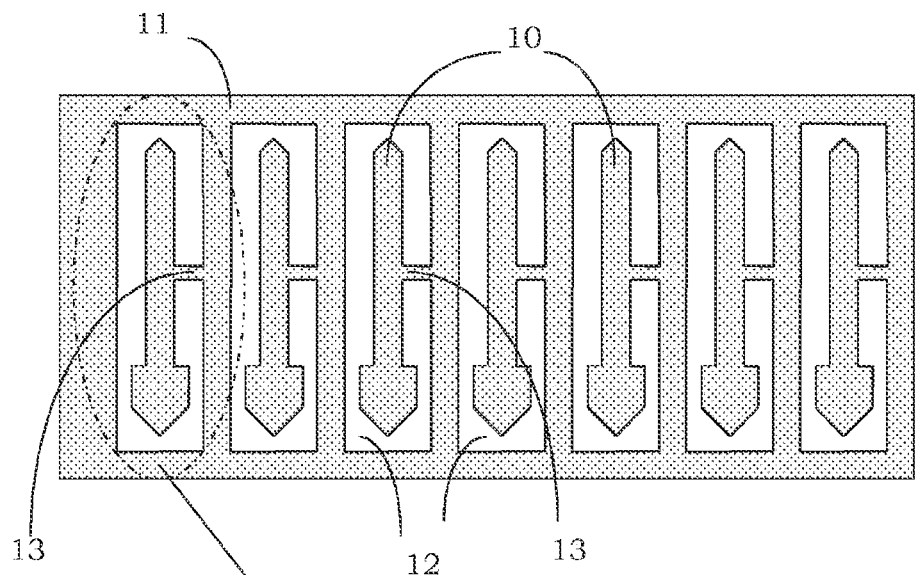
FIGS. 3A-3B and 4A-4B schematically show alternative embodiments of a plurality of contact probes and corresponding details relating to a single probe respectively, obtained by means of the method of FIGS. 2A-2C.
Figure 3B:
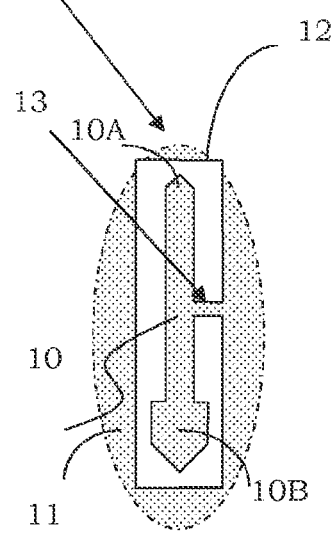
Figure 4A:
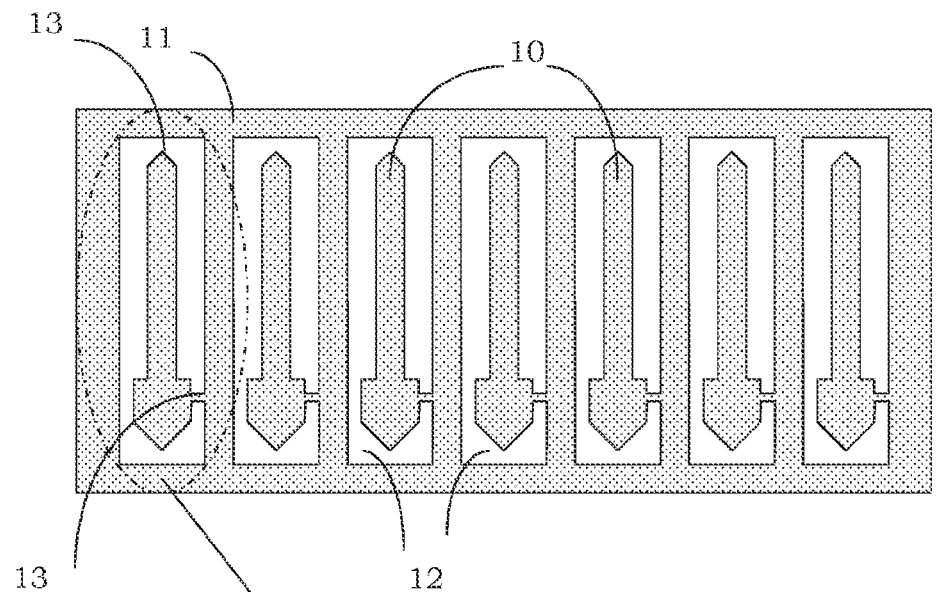
Figure 4B:
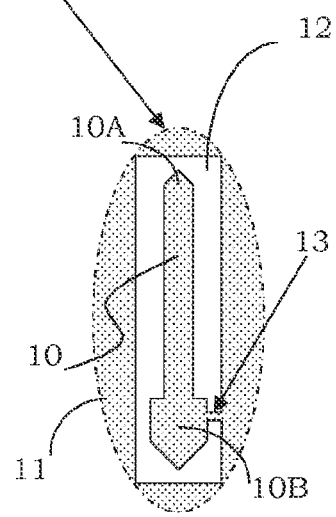
Figure 5:
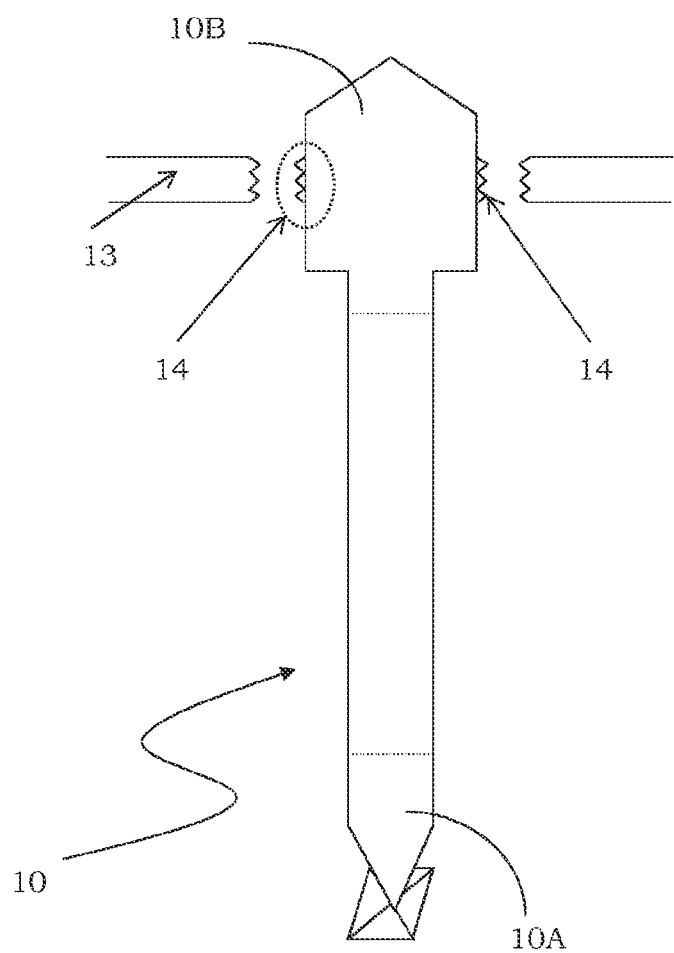
FIG. 5 schematically shows a contact probe realized according to the method of FIGS. 2A-2C.
Figure 6A:
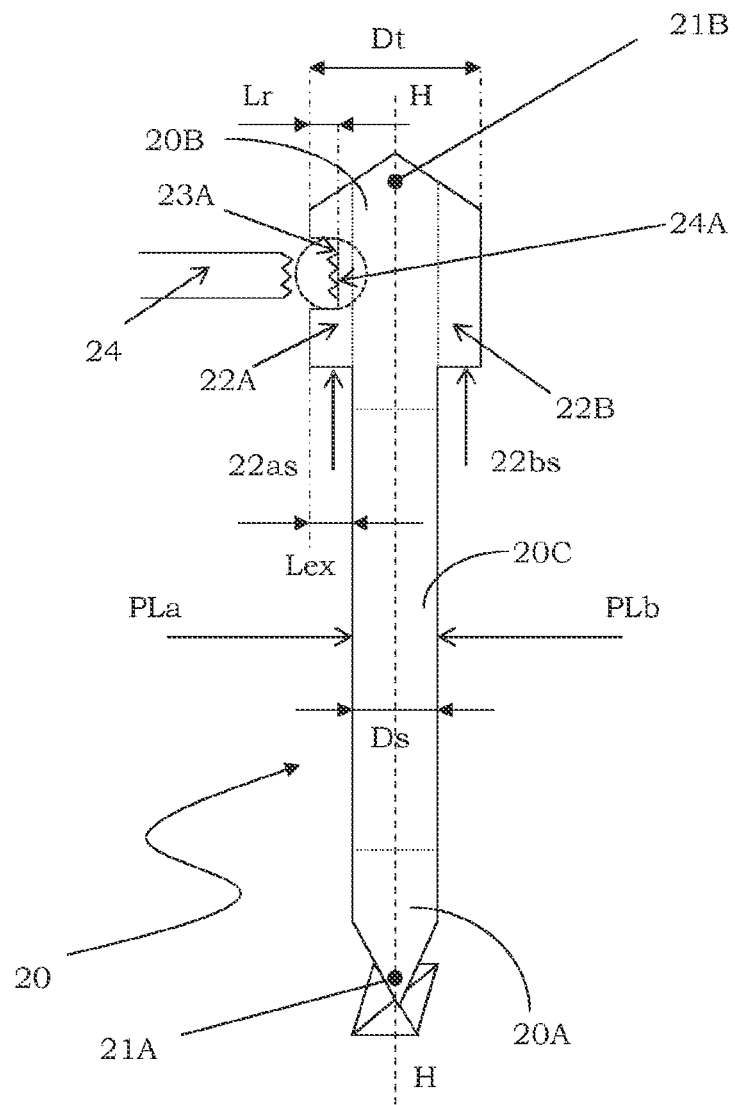
FIGS. 6A and 6B schematically show embodiments of the contact probe according to the disclosure.

With reference to said figures, and in particular to FIG. 6A, reference number 20 globally indicates a contact probe for a probe head for testing electronic devices, in particular integrated on a wafer, according to an embodiment of the present disclosure.

It should be pointed out that the figures represent schematic views of the contact probe and of the probe head according to the disclosure and are not drawn to scale, but instead they are drawn so as to enhance the important features of the disclosure.

Furthermore, the different aspects of the disclosure represented by way of example in the figures can obviously be combined with each other and interchangeable from one embodiment to another.

According to an aspect of the disclosure, the contact probe 20 comprises a so-called probe body 20C extended between respective end portions, in particular a contact tip 20A and a contact head 20B. Suitably, at least one end portion, in particular the contact head 20B, has transverse dimensions greater than the probe body 20C. More in particular, the contact head 20B has a transverse section with a diameter Dt greater than a diameter Ds of the transverse section of the probe body 20C, diameter meaning the maximum dimension of such sections.

As already seen in connection with the prior art, in this way, the contact head 20B allows ensuring that the contact probe 20 cannot slip out of corresponding guide holes realized in guides or dies of the contact head comprising it, in particular in the absence of a device under test on which the probes abut.

The contact tip 20A of the contact probe 20 is tapered and ends with a contact portion 21A intended to abut onto a contact pad of a device under test; analogously, the contact head 20B has a tapered portion ending with a contact portion 21B intended to abut onto a contact pad of a space transformer, in case of a probe head having non-constrained probes.

The contact portions 21A and 21B can be conformed so as to define a substantially punctiform contact, or can have a rounded shape or still a substantially flat shape, possibly having a diameter less than the rest of the end portion.

More in particular, the contact probe 20B comprises respective enlarged portions 22A and 22B, projecting in correspondence of respective and opposite side walls PLa and PLb of the contact probe 20, and arranged symmetrically with respect to a longitudinal development axis HH of the contact probe 20, the side walls PLa and PLb arranged on the left and on the right of the probe itself, respectively, in the local reference of the figure. In this way, the contact head 20B has a symmetrical configuration, with respect to the longitudinal development axis HH of the contact probe 20.

In this way the contact probe 20B has respective undercut walls 22as and 22bs, in correspondence of the enlarged portions 22A and 22B, adapted to abut onto a corresponding face of a die, in particular an upper die, preventing the contact probe 20 from slipping out of the die and therefore out of the probe head, for instance when the contact probe 20 does not abut onto a corresponding contact pad and tends to slide downwards, considering the local reference of the figure. More in particular, the enlarged portions 22A and 22B define undercut walls 22as and 22bs of equal length Lex having a value equal to 20-60% of the diameter of the probe Ds. In this way, the contact head 20B has a footprint diameter, in particular a head diameter Dt equal to the sum of the probe diameter Ds and of the lengths Lex: $Dt=Ds+2*Lex$.

Suitably according to the present disclosure, the contact head 20B of the contact probe 20 also comprises at least one indentation 23A arranged in correspondence of at least one of the enlarged portions 22A and 22B, in particular the enlarged portion 22A, and adapted to house at least one material scrap 24A, deriving from the breaking of a respective material bridge 24 due to the detachment of the contact probe 20 from a substrate wherein the probe has been obtained, for instance by laser cutting.

Suitably, said indentation 23A can extend inside said enlarged portion 22A or 22B by a length Lr equal to 5-30% of the length Lex, preferably with values comprised between 5 µm and 15 µm.

It is thus immediately apparent that, even in the presence of such a material scrap 24A, the contact probe 20 according to the present disclosure has a head diameter Dt equal to that of the known solutions, the involved dimensions being equal, such a material scrap 24A not projecting with respect to the footprint given by the contact head 20B.

In the most common applications, the length Lex of the undercut walls 22as and 22bs has values comprised between 10 µm and 25 µm, the probe diameter Ds has values comprised between 20 µm and 90 µm, and the head diameter Dt has values comprised between 30 µm and 120 µm.

Figure 6B:
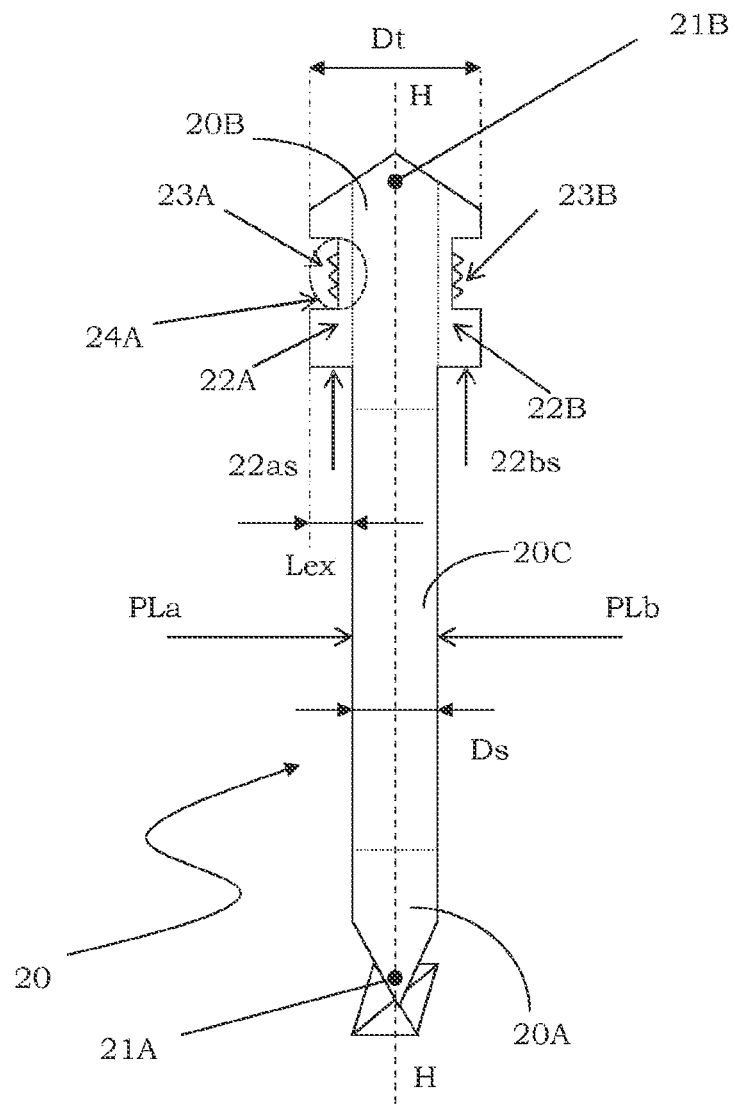

According to an alternative embodiment schematically shown in FIG. 6B, the contact head 20B of the contact probe 20 comprises respective indentations 23A and 23B realized in correspondence of both the enlarged portions 22A and 22B. Such indentations 23A and 23B allow housing respective material scraps 24A in correspondence of respective and symmetrical attachments of the contact head 20B to attachments material bridges 24 of the contact probe 20 from a substrate wherein the probe has been obtained, for instance by laser cutting.

Also in this case, the presence of the indentations 23A and 23B ensures that the contact probe 20 according to the present disclosure has a head diameter Dt equal to that of the known solutions, the involved dimensions being equal, also in the presence of material scraps 24A and 24B not projecting with respect to the footprint given by the contact head 20B.

Advantageously according to the present disclosure, it is therefore possible to approach to each other adjacent contact probes 20 in the probe head 30, anyway ensuring a minimum distance Dm which should elapse between the portions having the greatest dimensions of the probes, i.e. in correspondence of the relative contact heads 20B, without having to introduce a tolerance to take into account the material scraps 24A; in particular minimum distance Dm means a value adapted to avoid the contact between adjacent probes, usually comprised between 10 µm and 20 µm.

In this way the contact tips 20A of the contact probe 20 are also close to each other, i.e., it is possible to approach the contact pads 26A of the device under test 26, or better the centers of said pads, to pitch values analogous to the known solutions, even in the presence of such a material scrap 24A.

It is obviously possible to realize any number of material bridges 24, also placed in a non-centered and/or non-symmetrical manner of the contact head 20B of the contact probe 20 with respect to what is shown in FIGS. 6A and 6B, in a completely arbitrary manner.

Figure 7A:
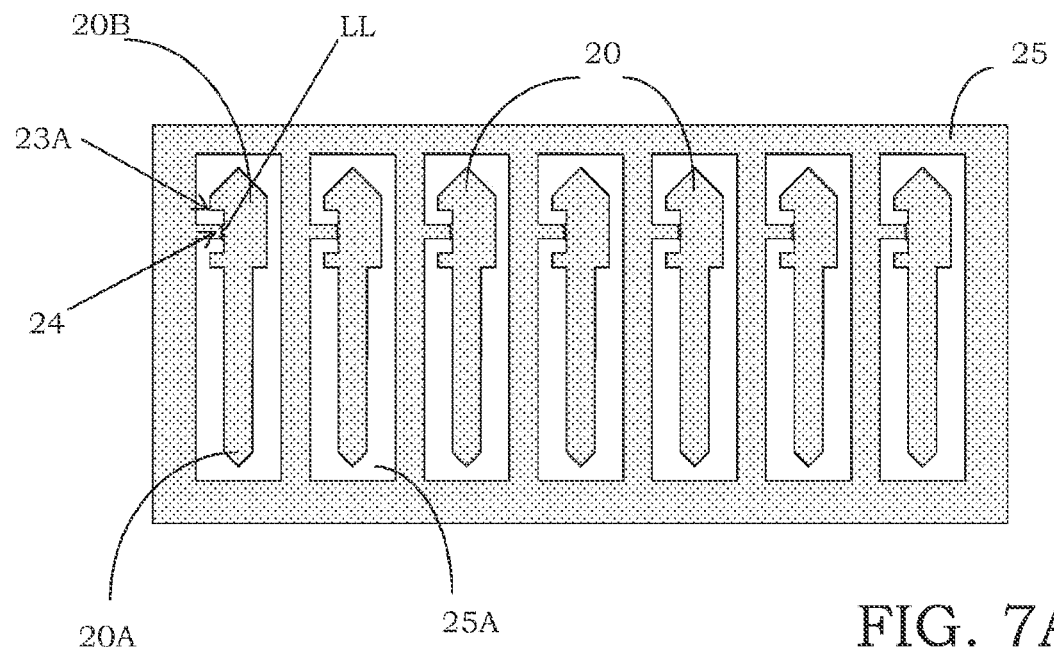
FIGS. 7A and 7B show respective pluralities of probes obtained by laser cutting and corresponding embodiments of FIGS. 6A and 6B, respectively.

It is thus possible to realize the contact probes 20 according to the present disclosure by defining them by laser cutting from a suitable substrate 25, realized with a material suitable for making contact probes indeed. Each contact probe 20 is thus realized in a suitable substantially frame-like slot, simply indicated as frame 25A, obtained in the substrate 25 by removing material and adapted to surround the contact probe 20, as schematically shown in FIG. 7A.

More in particular, a plurality of contact probes 20 is realized, which are anchored to the substrate 25 by at least one material bridge 24 having an attachment point in correspondence of respective indentations 23A realized in the contact heads 20B of such contact probes 20, in accordance with the embodiment of FIG. 6A.

Figure 7B:
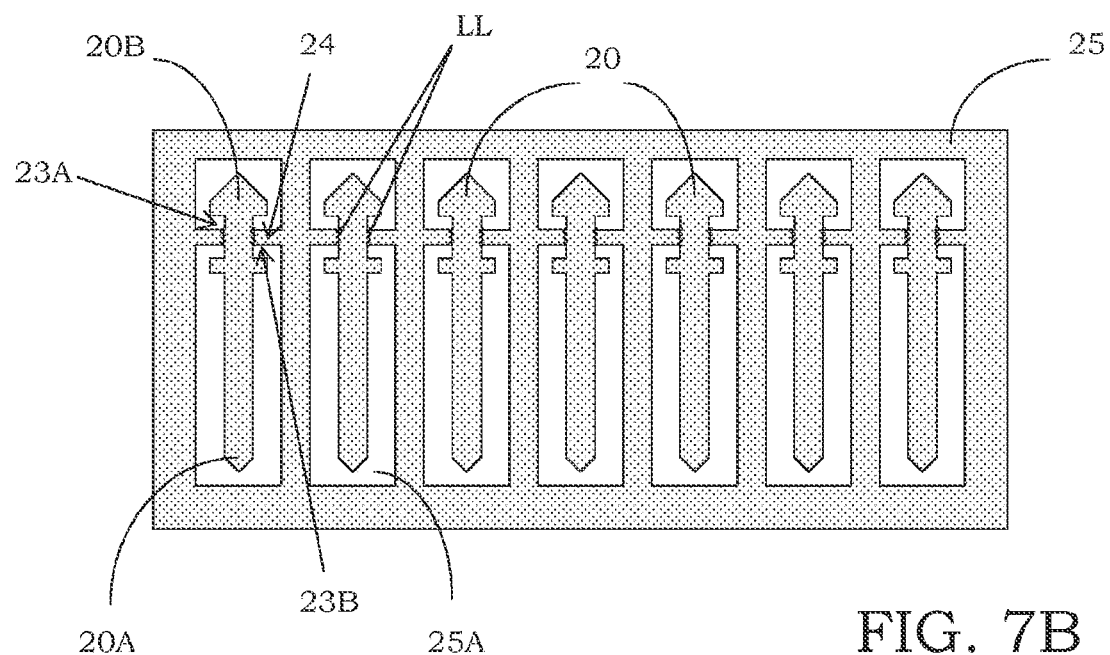

Alternatively, as schematically shown in FIG. 7B, it is possible to realize the plurality of contact probes 20 in the substrate 25 so that they have respective attachment points of the material bridges 24 in correspondence of respective and symmetrical indentations 23A and 23B realized in the contact heads 20B of said contact probes 20, in accordance with the embodiment of FIG. 6B.

Therefore, the method comprises a further step of separating the contact probes 20 from the substrate 25 by breaking the material bridge or bridges 24. Suitably, according to the present disclosure, such a separation step of the contact probes 20 leaves material scraps 24A and/or 24B each arranged inside a respective indentation 23A and/or 23B.

Suitably, as shown in FIGS. 7A and 7B, each material bridge 24 can be provided with at least one weakening line LL which passes therethrough and which is adapted to facilitate the separation of the probe from the substrate 25 by breaking the integrity of the material bridge 24 itself.

In particular, such a weakening line LL can be arranged in proximity of the contact probe 20, so that the breaking thereof during the separation of the contact probe 10 from the substrate 25 involves a retention of most part of the material bridge 24 anchored to the substrate 25.

Suitably, the weakening lines LL can be obtained by means of through-holes in the substrate 25, said through-holes can have any shape, for instance round, oval, rectangular, inclined, just to cite some of them. Alternatively, the weakening lines LL can be realized by means of a local thinning of the substrate 25 in correspondence thereof, in a direction Z orthogonal to the plane of the substrate 25 itself.

Figure 8:
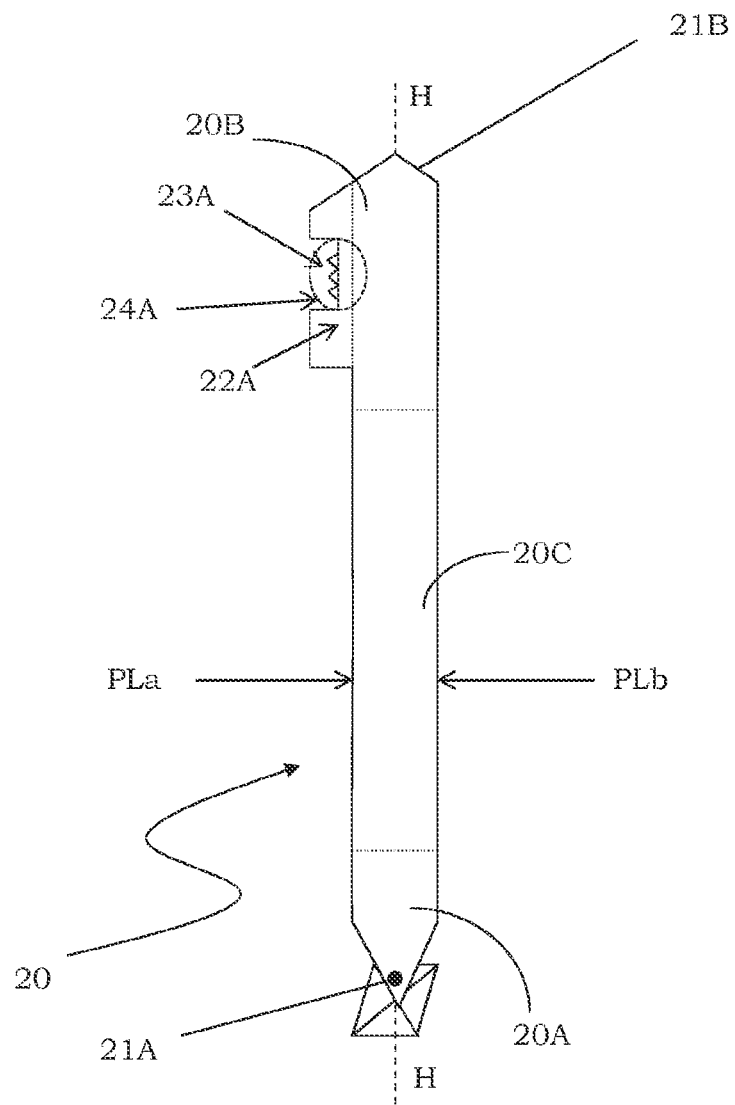
FIG. 8 shows a further embodiment of the contact probe according to the disclosure.

According to an alternative embodiment of the contact probe 20 according to the present disclosure, schematically shown in FIG. 8, the contact head 20B comprises only one enlarged portion 22A, only projecting in correspondence of a side wall of the contact probe 20, in the shown example in correspondence of the side wall PLa of the contact probe 20, arranged on the left of the probe itself, in the local reference of the figure. On the contrary, in correspondence of a second and opposite face PLb, the contact head 20B does not have enlarged and projecting portions. In this way, the contact head 20B has an asymmetrical configuration, with respect to a longitudinal development axis HH of the contact probe 20.

It should be pointed out that, also in this case, the contact head 20B has in this way an undercut wall 22as, in correspondence of the enlarged portion 22A, adapted to abut onto a corresponding face of a die, in particular an upper die, preventing the contact probe 20 from slipping out of the die and therefore out of the probe head, for instance when the contact probe 20 does not abut onto a corresponding contact pad and tends to slide downwards, considering the local reference of the figure. More in particular, the enlarged portion 22A defines an undercut wall 22as that can have a length Lex with a value equal to 20-60% of the probe diameter Ds.

In this way, suitably according to this embodiment, the contact head 20B has a footprint diameter, in particular a head diameter Dt equal to the sum of the probe diameter Ds and of the length Lex: Dt=Ds+Lex, less, the involved dimensions being equal, than the head diameter Dt of the embodiments shown in FIGS. 6A and 6B and therefore also than that of the known solutions.

Also in this case, the contact head 20B of the contact probe 20 further comprises at least one indentation 23A arranged in correspondence of the enlarged portion 22A, and adapted to house at least one material scrap 24A, deriving from the breaking of a respective material bridge 24 due to the detachment of the contact probe 20 from a substrate wherein the probe has been obtained, for instance by laser cutting, without increase in the footprint thereof, in particular of the head diameter Dt.

Figure 9A:
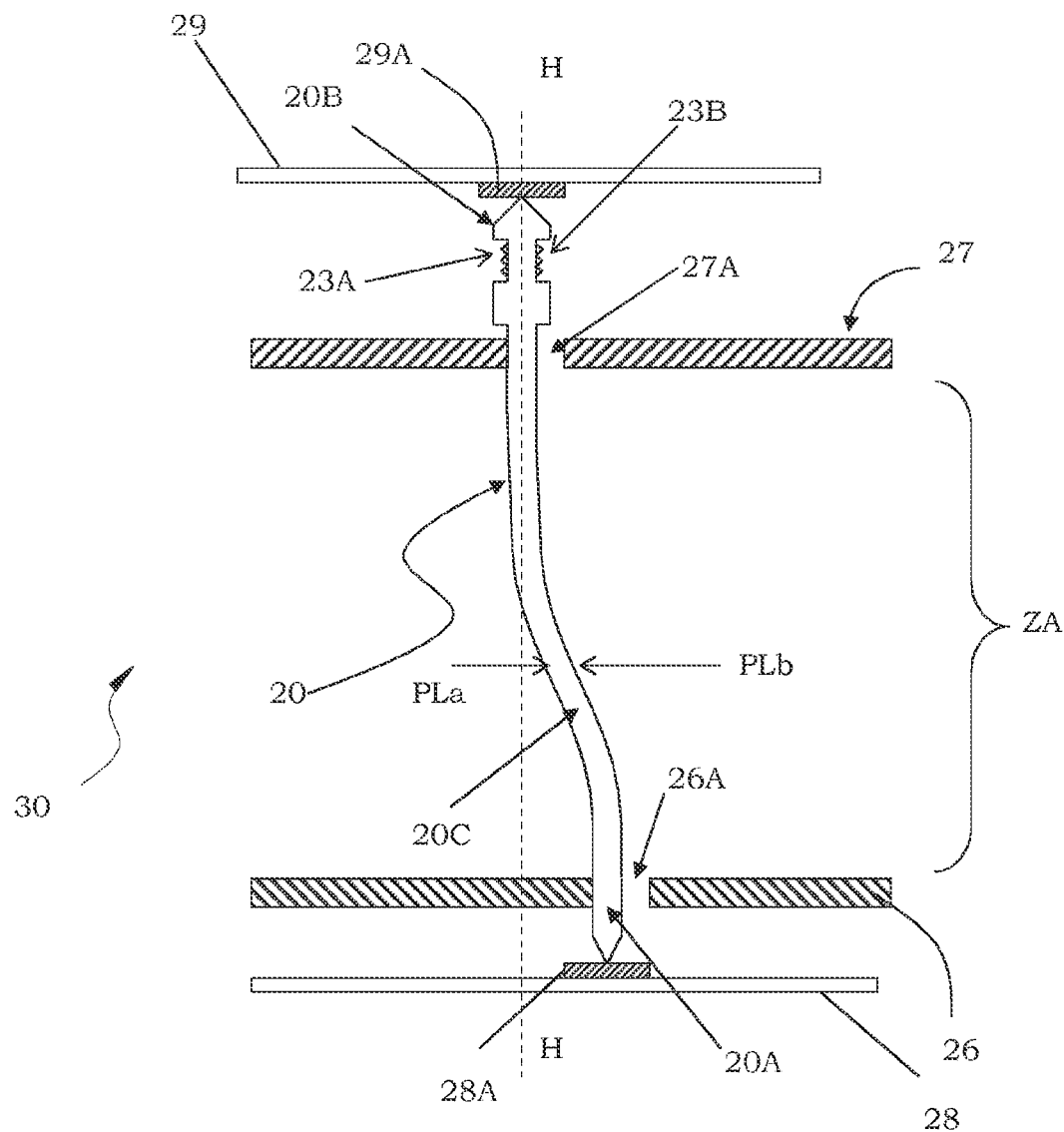
FIGS. 9A and 9B show respective probe heads according to the present disclosure, in particular with vertical probes and shifted plates, comprising contact probes corresponding to the embodiments of FIGS. 6B and 8, respectively.
Figure 9B:
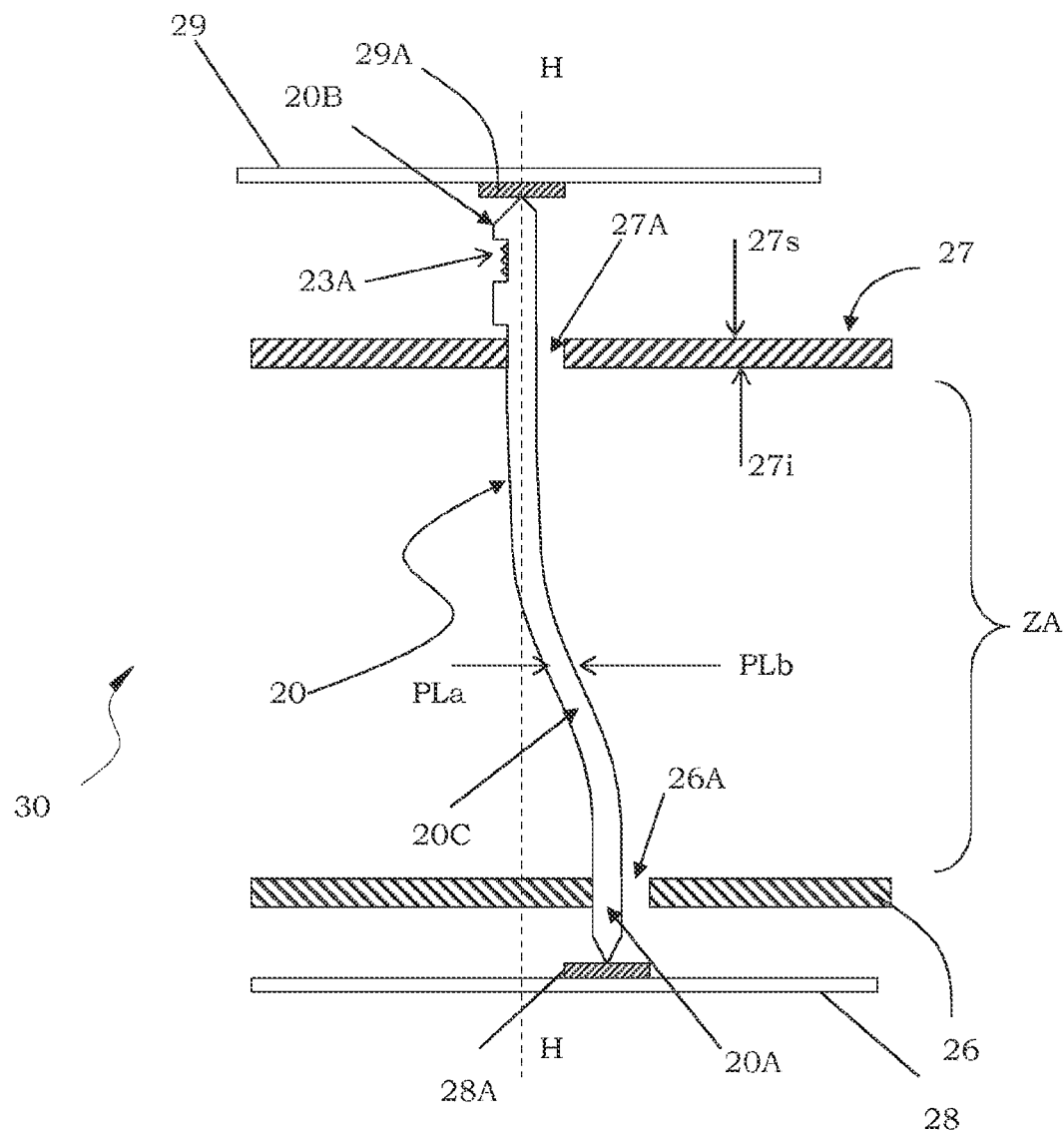

Contact probes of the described type can be used to realize a probe head, as schematically shown in FIGS. 9A and 9B, wholly indicated with number reference 30.

In particular, the probe head 30 houses a plurality of contact probes 20 and comprises at least one lower die 26 and an upper die 27, provided with respective guide holes 26A and 27A wherein the contact probes 20 of the type previously described slide. For the sake of simplicity, in FIGS. 9A and 9B just a contact probe 20 is shown, respectively of the type described in FIGS. 6B and 8.

Each contact probe 20 has the contact tip 20A adapted to abut onto a corresponding contact pad 28A of a device under test 28 and the probe head 20B adapted to abut onto a contact pad 29A of a space transformer 29.

In the shown example, the probe head 30 is of the type having vertical probes and shifted plates; the shown probe comprises the probe body 20C which extends in an air gap ZA, between the upper die 27 and the lower die 26. As previously, for the sake of convenience, the terms "upper" and "lower" have been used in connection to a local reference system of the figure, without considering them in a limiting way for the disclosure.

In particular, the lower and upper dies, 26 and 27, are mutually suitably shifted so as to impart to said contact probes 20 which slide in their guide holes 26A and 27A, a pre-deformation in correspondence of the air gap ZA between the dies, such a pre-deformation increasing during the operation of the probe head 30, when the contact tips 20A of the contact probes 20 are in a pressing contact onto the contact pads 28A of the device under test 28 and the contact probes 20 bend in correspondence of the air gap ZA.

The contact probes 20 have sections, in particular in correspondence of the probe body 20C, having a dimeter that varies from 0.8 mils to 3 mils, selected based on the applications which the probe head 30 is intended to, whereas the probe heads 20B, provided with the enlarged portions 22A and/or 22B, have sections having a diameter that varies from 1 mils to 3.5 mils, diameter meaning the maximum dimension of such cross-sections that are not necessarily circular.

It should be pointed out that, in the shifted-plate configuration shown in FIG. 9B, the contact probes 20 are housed in the probe head 30 so as to have the enlarged portion 22A projecting from a wall of the contact probe 20, in the example the wall PLa resting on a wall of the guide hole 27A of the upper die 27 underneath it.

In this way, the undercut wall 22as of the enlarged portion 22A is adapted to abut onto a first face of the upper guide 27, in particular the face in front of the space transformer 29, indicated as upper face 27s, still using the local reference of the figure; moreover, the upper die 27 has a second and opposite face, indicated as lower face 27i.

Advantageously according to the present disclosure, thanks to the configuration of the contact probe 20 of the embodiment shown in FIG. 8, it is possible to approach one another adjacent contact probes 20 in the probe head 30, anyway ensuring a minimum distance Dm that should elapse between the portions having the greatest dimensions of the probes, i.e. in correspondence of the relative probe heads 20B, as schematically shown in FIG. 10A, where minimum distance Dm always means a value adapted to avoid the contact between adjacent probes, usually comprised between 10 µm and 20 µm.

Obviously, in this way the contact tips 20A of the contact probe 20 are approached, i.e. it is possible to approach the contact pads 26A of the device under test 26, or better the centers of such pads by reducing the pitch P1*; in other terms, in this way it is advantageously possible to test a device having a pitch P1* less than the embodiments of the contact probe 20 shown in FIGS. 6A and 6B and therefore also of the known solutions.

According to an alternative embodiment, schematically shown in FIG. 10B, inside the probe head 30, it is also possible to arrange the contact probes 20 so that adjacent probes 20, 20' in a longitudinal or transverse direction have enlarged portions 22A, 22'A projecting from opposite walls PLa, PL'b. In this way, a first probe 20 comprises a projecting portion 22A that projects from a first wall thereof PLa and a second probe 20', adjacent to the first probe 20 in a longitudinal or transverse direction, comprises a respective projecting portion 22'A that projects from a second and opposite wall PL'b thereof; in other terms, adjacent probes 20, 20' have enlarged portions 22A, 22'A projecting from opposite sides with respect to such a longitudinal or transverse direction of the probes flanking.

In this way it is possible to further approach adjacent probes, in particular in correspondence of the contact heads thereof, though ensuring the minimum distance Dm adapted to avoid possible contacts between the probes. Therefore, the centers of said pads are also further approached, with a consequent further reduction of the pitch P1*, as indicated in the figure.

It is also pointed out that, advantageously according to the disclosure, the probe head proposed allows reducing the pitch P1* of the device under test 28, namely approaching the centers of the corresponding contact pads 28A, up to the requirements requested by the most modern integration and design technologies of integrated circuits.

Figure 11:
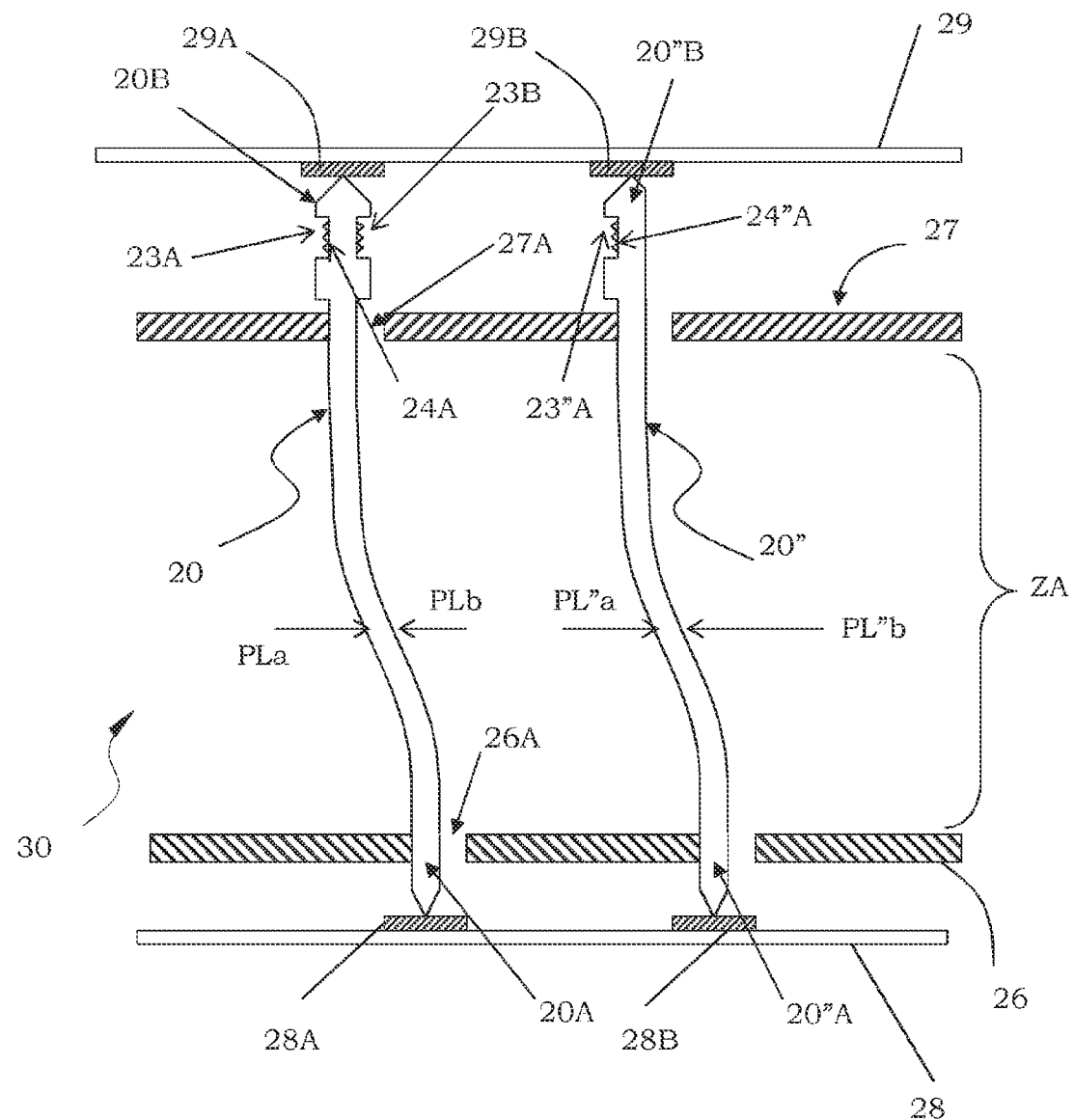
FIG. 11 shows a probe head according to the present disclosure, in particular with vertical probes and shifted plates, comprising contact probes corresponding both to the embodiment of FIG. 6B and to the embodiment of FIG. 8.

A particularly advantageous embodiment of the probe head 30 according to the present disclosure is schematically shown in FIG. 11.

The probe head 30 in particular comprises a plurality of contact probes 20 having probe heads 20B provided with enlarged portions 22A and 22B projecting from both side walls of the probe, as in the embodiments of FIGS. 6A and 6B (the latter being the one shown in FIG. 11 by way of example), indicated in the following as symmetrical contact probes 20, along with a plurality of contact probes, indicated with reference number 20" with probe heads 20"B provided with only one enlarged portion 22"A projecting from only one side wall, in particular the first wall PL"a, indicated in the following as asymmetrical contact probes 20".

As previously, the enlarged portions 22A and/or 22B and 22"A comprise respective indentations 23A and/or 23B and 23"A adapted to house the material scraps 24A, 24"A due to the separation of the contact probes 20, 20" from a substrate 25 wherein they were formed.

In the example shown in the figure, the probe head 20 is of the shifted-plates type and therefore comprises the lower die 26 and the upper die 27, planar and parallel to each other and provided with further respective guide holes, 26B and 27B, within which the asymmetrical contact probes 20" are slidingly housed.

More in particular, each asymmetrical contact probe 20" comprises a contact head 20"B adapted to abut onto further contact pads 29B of the space transformer 29, as well as a contact tip 20"A adapted to abut onto further contact pads 28B of the device under test 28.

It is pointed out that the asymmetrical contact probes 20" have a maximum footprint, in particular a head diameter Dt less than a corresponding head diameter of the symmetrical contact probes 20. In this way it is thus possible to test integrated devices having regions with different pitches by means of the same probe head 30 made as shown in FIG. 11.

It is in fact known that the most recent developments in the technology for realizing integrated circuits allowed to realize devices with bidimensional arrays of contact pads having relative distances or pitch different in various regions of the device itself. More in particular such a device comprises a first region, indicated as region with a big pitch, wherein the contact pads have a greater distance between the relative centers with respect to a second region, indicated as region with a small pitch, wherein the pads are closer to each other. In this case we can talk about multi-pitch devices.

Suitably, the probe head 30 according to the present disclosure as shown in FIG. 11 allows testing such devices, in particular using the symmetrical contact probes 20 in the first region with a big pitch and the asymmetrical contact probes 20" in the second region with a small pitch for testing multi-pitch devices.

The considerations made are also valid for different embodiments here not disclosed, but however subject matter of the present disclosure, such as, for instance, a probe head having an upper die and/or a lower die comprising several supports. Furthermore, the measures taken in connection with an embodiment can be also used for other embodiments and can be freely combined with each other also in a number greater than two.

In conclusion, the configuration of the contact probe and the corresponding probe head according to the embodiments of the disclosure allow realizing a high packing of the probes themselves and therefore testing configurations of contact pads also very close to each other, the limit being given by their enlarged head portions not having to take into account possible material scraps left by the separation of the probes from a substrate where they have been realized.

In this way, advantageously according to the disclosure, it is possible to realize the probes by using the most modern laser technologies, overcoming the limits of other technologies also in the case of integrated devices under test with a very small pitch, i.e. with the centers of the corresponding contact pads very close to each other, in particular up to the requirements requested by the most modern integration and design technologies of integrated circuits.

In the alternative embodiment with asymmetrical probe heads, it is even possible to increase the packing of such probes thanks to the reduced footprint of the corresponding head portions having enlarged portions only projecting from a side wall of the probe.

The advantage connected to the fact that the contact probes are realized in a simple manner and with low costs, in particular by using the laser technology, is not to be ignored.

In a preferred embodiment, the probe head according to the present disclosure also allows testing multi-pitch devices.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A contacting element, comprising:
respective first and second end portions; and
a body extended in a longitudinal direction between the first and second end portions,
the first end portion having transverse dimensions greater than the body,
the contacting element including material scraps due to a separation from a substrate wherein the contacting element is realized,
wherein the first end portion includes only one enlarged portion, projecting in correspondence of a first side wall of the contacting element and the only one enlarged portion includes at least one indentation configured to house the material scraps being on the contacting element.

2. The contacting element according to claim 1, wherein the contact element is realized by laser cutting the substrate.

3. The contacting element according to claim 1, wherein the first end portion is a contact head configured to abut onto a contact pad of a space transformer and the second end portion is a contact tip configured to abut onto a contact pad of a device under test.

4. The contacting element according to claim 1, wherein the only one enlarged portion defines an undercut wall configured to abut onto a corresponding face of a guide housing the contacting element.

5. The contacting element according to claim 4, wherein the contact head has a footprint diameter equal to the sum of a diameter of the probe body and of a length of the undercut wall, diameter meaning the maximum dimension of corresponding cross-sections.

6. The contacting element according to claim 4, wherein the undercut wall has a length having a value equal to 5-30% of the diameter of the probe body.

7. The contacting element according to claim 6, wherein the weakening line is arranged on the bridge of material in proximity of the contacting element at the indentation.

8. The contacting element according to claim 1, wherein the at least one indentation extends inside the only one enlarged portion of the contact head with a length having values comprised between 5 µm and 15 µm.

9. The contacting element according to claim 1, wherein the material scraps are in correspondence of a weakening line which passes through a material bridge and is configured to facilitate the separation of the contacting element from the substrate by breaking the integrity of the material bridge.

10. A probe head for testing electronic devices, comprising:
a plurality of contact probes; and
a first and second plate-shaped supports separated one another by a suitable air gap,
the first and second plate-shaped supports having a plurality of guide holes for slidingly housing the plurality of contact probes,
wherein each contact probe includes:
respective first and second end portions; and
a probe body extended in a longitudinal direction between the first and second end portions, the first end portion having transverse dimensions greater than the probe body,
the contact probe including material scraps due to a separation from a substrate wherein the contact probe is realized and the first end portion includes only one enlarged portion projecting in correspondence of a first side wall of the contact probe and the only one enlarged portion includes at least one indentation configured to house the material scraps being on the contact probe.

11. The probe head according to claim 10, wherein the contact probes are realized by laser cutting the substrate.

12. The probe head according to claim 10, wherein the first end portion of the contact probes is a contact head configured to abut onto a contact pad of a space transformer and the second end portion of the contact probes is a contact tip configured to abut onto a contact pad of a device under test.

13. The probe head according to claim 10, wherein the only one enlarged portion defines a first undercut wall configured to abut onto a corresponding face of the plate-shaped support housing the corresponding contact probe.

14. The probe head according to claim 10, wherein the material scraps of the contact probe are in correspondence of a weakening line which passes through a material bridge and is configured to facilitate the separation of the contact probe from the substrate by breaking the integrity of the material bridge, the weakening line being arranged on the bridge of material in proximity of the respective contact probe at the indentation.

15. The probe head according to claim 10, wherein the plate-shaped supports are mutually suitably shifted so as to impart to the contact probes, which slide in the respective guide holes, a pre-deformation in correspondence of the air gap, wherein the enlarged portion of the first end portion of each of the contact probes protrudes from a wall of the contact probe, which rests on a wall of the guide hole of the plate-shaped support in proximity of the first end portion.

16. The probe head according to claim 15, further comprising adjacent probes in a longitudinal or transverse direction with enlarged portions projecting from a corresponding wall.

17. A contact probe, comprising:
respective first and second end portions;
a probe body extended in a longitudinal direction between the first and second end portions; and
a first side wall and a second side wall, opposite one another,
wherein the first end portion is a contact head configured to abut onto a contact pad of a space transformer and the second end portion is a contact tip configured to abut onto a contact pad of a device under test and the first end portion having transverse dimensions greater than the probe body,
the contact probe includes material scraps due to a separation from a substrate wherein the contact probe is realized by laser cutting,
wherein the first end portion includes only one enlarged portion, projecting in correspondence of a first side wall of the contact probe and the only one enlarged portion includes at least one indentation configured to house the material scraps being on the contact probe.

18. The contact probe according to claim 17, wherein the only one enlarged portion defines an undercut wall configured to abut onto a corresponding face of a guide housing the contact probe.

19. The contact probe according to claim 17, wherein said material scraps are in correspondence of a weakening line which passes through a material bridge and is configured to facilitate the separation of the contact probe from the substrate by breaking the integrity of the material bridge.

20. The contact probe according to claim 19, wherein the weakening line is arranged on the bridge of material in proximity of the contact probe at the indentation.

* * * * *

UNITED STATES PATENT AND TRADEMARK OFFICE
CERTIFICATE OF CORRECTION

| | | |
|---|---|---|
| PATENT NO. | : 11,442,080 B2 | Page 1 of 1 |
| APPLICATION NO. | : 17/244498 | |
| DATED | : September 13, 2022 | |
| INVENTOR(S) | : Roberto Crippa et al. | |

It is certified that error appears in the above-identified patent and that said Letters Patent is hereby corrected as shown below:

On the Title Page

Insert Item (30) Foreign Application Priority Data:
--(30) Foreign Application Priority Data"
Dec. 16, 2016 (IT).................. 102016000127507--

Signed and Sealed this
Twenty-first Day of May, 2024

Katherine Kelly Vidal
*Director of the United States Patent and Trademark Office*